United States Patent
Kawata et al.

(10) Patent No.: US 6,830,852 B2
(45) Date of Patent: Dec. 14, 2004

(54) STENCIL RETICLES FOR USE IN CHARGED-PARTICLE-BEAM MICROLITHOGRAPHY, AND PATTERN-DETERMINATION METHODS FOR SUCH RETICLES

(75) Inventors: Shintaro Kawata, Moriya (JP); Koichi Kamijo, Kumagaya (JP); Shinichi Takahashi, Tokyo (JP)

(73) Assignee: Nikon Corporation, Tokyo (JP)

( * ) Notice: Subject to any disclaimer, the term of this patent is extended or adjusted under 35 U.S.C. 154(b) by 28 days.

(21) Appl. No.: 10/199,279

(22) Filed: Jul. 19, 2002

(65) Prior Publication Data

US 2003/0017401 A1 Jan. 23, 2003

(30) Foreign Application Priority Data

| Jul. 19, 2001 | (JP) | 2001-219425 |
| Aug. 2, 2001 | (JP) | 2001-234666 |
| Aug. 27, 2001 | (JP) | 2001-255563 |

(51) Int. Cl.$^7$ .................................... G03F 9/00
(52) U.S. Cl. ............... 430/5; 430/30; 430/296; 430/942
(58) Field of Search ................ 430/5, 30, 296, 430/942

(56) References Cited

U.S. PATENT DOCUMENTS 5,166,888 A  11/1992  Engelke ................ 364/491

OTHER PUBLICATIONS

Morinaga et al., "Investigation of Mask Splitting for Stencil Masks for EPL (Electron Projection Lithography)," *Extended Abstracts of 61$^{st}$ Autumn Meeting, Japan Society of Applied Physics*, Sep. 2000, Abstract 7a–X–3. [Abstract only, with English translation.].

Morinaga et al., "Study of Mask Splitting Method Based on Computational Geometry Considerations," *Extended Abstracts of 61$^{st}$ Autumn Meeting, Japan Society of Applied Physics*, Sep. 2000, Abstract 7a–X–8. [Abstract only, with English translation.].

*Primary Examiner*—Christopher G. Young
(74) *Attorney, Agent, or Firm*—Klarquist Sparkman, LLP

(57) ABSTRACT

Methods are provided for complementarily dividing, on a divided stencil reticle as used in charged-particle-beam (CPB) microlithography, certain pattern elements into complementary pattern-element portions, and for exposing the pattern-element portions without significantly reducing throughput. For example, a large-area pattern element, having length and width equal to or greater than a division criterion L, is complementarily divided into linear pattern-element portions each having a width<L, and length≧L. Each pattern-element portion can have respective overlap regions along edges at which the portions as projected are conjoined on a lithographic substrate. The pattern-element portions are defined on at most two complementary reticles (or reticle portions) thereby imposing less adverse effect on throughput than conventionally. In other embodiments, pattern elements are divided into complementary pattern-element portions based on profile and shape of certain blocking regions versus non-blocking regions of the pattern element. The pattern elements are divided so as to reduce size errors that otherwise would be excessive at corners of the pattern elements when projected onto a substrate. I.e., whenever the size error exceeds a predetermined tolerance, then the pattern element is complementarily divided.

32 Claims, 11 Drawing Sheets

STENCIL RETICLES FOR USE IN CHARGED-PARTICLE-BEAM MICROLITHOGRAPHY, AND PATTERN-DETERMINATION METHODS FOR SUCH RETICLES

FIELD

This disclosure pertains to microlithography performed using a charged particle beam such as an electron beam or ion beam. Microlithography is a key technology used in the production of microelectronic devices such as semiconductor integrated circuits, writing and pickup heads used in magnetic memory devices, displays, and micromachines, for example. More specifically, the disclosure pertains to reticles as used in charged-particle-beam (CPB) microlithography, especially to so-called "stencil" reticles and to methods for defining a pattern on one or more such reticles.

BACKGROUND

As microelectronic devices have reached ever-higher levels of integration, it has become increasingly difficult to use optical microlithography for forming circuits and other patterns on the surface of a substrate. Consequently, "next generation" lithography (NGL) technology currently is under intensive development. A promising NGL technology is the so-called "charged-particle-beam" (CPB) lithography technology that utilizes a charged particle beam such as an electron beam for making pattern exposures. CPB lithography offers prospects of substantially greater pattern resolution for reasons similar to the reasons for which electron microscopy yields better pattern resolution than optical microscopy.

Aberrations, distortion, and the like in a CPB optical system make it impossible for a wide pattern area (e.g., corresponding to the area of a single "chip") to be transfer-exposed in a single exposure "shot." Consequently, patterns must be a transfer-exposed in multiple steps each pertaining to a respective portion of the pattern. More specifically, a pattern for a layer of a chip is divided into multiple exposure units (typically called "subfields") each defining a respective portion of the pattern. The pattern portions defined in the subfields are transferred individually to a lithographic substrate, on which respective images of the pattern portions are formed adjacent each other in a manner that achieves "stitching" of the pattern portions together to form the complete pattern for a chip.

This manner of exposure is diagrammed in FIGS. 12 and 13. FIG. 12 depicts a lithographic substrate ("wafer") on which multiple chip patterns have been formed. The pattern for a single chip is divided into multiple stripes (four stripes are shown), and each stripe contains multiple subfields arranged in a rectilinear array of rows and columns. The corresponding pattern as defined on the reticle (not shown in FIG. 12) is similarly divided. FIG. 13 depicts an actual exposure performed using a charged particle beam. The reticle, situated upstream in the figure, is mounted on a reticle stage (not shown). The substrate, situated downstream in the figure, is mounted on a wafer stage (not shown). The reticle stage and a wafer stage move the reticle and substrate in the directions shown at respective constant velocities. Note that the stage-movement directions are opposite each other. In the figure, an "illumination beam" is shown in position to begin exposure of a row of subfields in a stripe on the reticle. Similarly, the "patterned beam," propagating downstream of the reticle, is shown in position to begin imaging of the subfields in a corresponding row in a corresponding stripe on the substrate. The illumination beam is directed to the desired subfield on the reticle by an "illumination-optical system" and the patterned beam is directed to the desired subfield on the substrate by a "projection-optical system."

As exposure of the stripe progresses, the respective stages move the reticle and substrate in the directions shown while deflectors in the illumination-optical system and projection-optical system deflect the illumination beam and patterned beam, respectively, laterally as shown. Note that the directions of beam deflection are substantially perpendicular to the respective directions of stage movement. Thus, the subfields in each row and the rows of subfields in each stripe are exposed in sequential order. After exposure of a row of subfields is complete, exposure of the subsequent row begins, but with a direction of beam deflection that is opposite the direction of beam deflection used in the just-completed row. In other words, the subfields in the rows are exposed in a raster manner, which is time-efficient and thus maximizes throughput.

Since the respective pattern portion in each subfield is exposed in a respective "shot," throughput is greater using the depicted technique than was obtained previously using conventional "direct writing," "cell projection," and "character projection" techniques of performing CPB microlithography.

Further with respect to a reticle for use in CPB microlithography as shown in FIGS. 12 and 13, the subfields are defined in respective membrane portions of the reticle. The membrane portions are not contiguous with each other but rather are divided from one another by support struts. The struts provide substantial mechanical strength to the membrane portions. In a representative membrane portion, the respective subfield (which is the portion of the membrane portion actually defining the respective portion of the pattern) is surrounded by a non-patterned "skirt." The skirt is the region of the membrane portion in which the edges of the illumination beam fall whenever the respective subfield is being illuminated by the illumination beam for exposure. Thus, as each subfield is exposed, only the respective pattern portion is transferred to the substrate.

Before CPB lithographic exposure can be performed, the pattern to be exposed on the substrate must be defined on the reticle. CPB microlithography reticles can be classified broadly into two types. A first type is the so-called "stencil" reticle, in which pattern elements are defined as respective voids (through-holes) in a reticle membrane that is 1 to 5 $\mu$m thick. The voids are highly transmissive to the incident illumination beam with substantially no forward scattering, whereas intervening portions of the reticle membrane cause substantial forward scattering of charged particles in the illumination beam. A second type of reticle is the so-called "continuous-membrane" reticle, in which pattern elements are defined as respective openings in a highly scattering layer formed on a continuous, relatively low-scattering membrane layer. In other words, the openings have relatively high transmissivity to the incident beam, and regions occupied by the highly scattering layer have relatively low transmissivity to the incident beam. "Transmissivity" as referred to here takes into account the degree of forward-scattering. A relatively low transmissivity means not only that a portion of the beam may be absorbed but also that portions of the incident beam transmitted through the respective region of the reticle are forward scattered sufficiently so as not to reach the substrate.

With either type of reticle, a "contrast aperture" is situated at a beam crossover of the projection-optical system. As the patterned beam (containing both scattered and relatively non-scattered charged particles) propagates from the reticle to the substrate, the contrast aperture blocks the relatively highly scattered charged particles of the beam, thereby preventing such particles from reaching the substrate. Relatively low-scattered and non-scattered charged particle are transmitted by the scattering aperture and focused on the substrate. Thus, the image formed on the substrate is provided with contrast.

A continuous membrane reticle as summarized above exhibits problems with thermal absorption of incident charged particles of the illumination beam. As a result, a continuous membrane reticle tends to exhibit chromatic aberration. A stencil reticle, on the other hand, does not exhibit these problems, which is regarded as a desirable aspect of stencil reticles because better pattern resolution usually can be obtained with them.

However, stencil reticles are prone to certain problems if the reticle defines "donut"-shaped (annular) pattern features or linear pattern elements longer than a certain length. For example, if a pattern element is annular, then the membrane portion surrounded by the annular opening in the membrane is unsupported. Annular pattern elements must be divided into at least two complementary portions requiring separate exposure onto the substrate. Hence, at least two separate exposures are required to expose annular pattern elements. The projected portions must be positioned on the substrate such that the portions are "stitched together" properly to form the complete annular element of the pattern. This manner of dividing certain pattern elements into complementary portions is termed "complementary division."

Complementary division also is required whenever linearly extended pattern elements are defined as respective openings in the membrane of a stencil reticle. Linearly extended elements (i.e., having a length greater than a threshold length "L") are flanked by membrane regions that are weak and easily subject to deformations such as bending, sagging, and the like. (Preventing bending and sagging of these portions of the membrane would require application of substantial tensile force to the membrane, causing undesired changes to the shape of the element-defining apertures in the membrane.) Hence, these pattern elements also must be subject to complementary division.

On a stencil reticle, an annular pattern element requiring complementary division is relatively easy to identify from the contour of the pattern element. In contrast, linearly extended and other pattern elements defined by through-holes that excessively weaken the membrane or cause reticle distortions are problematic because reliable identification of such elements is difficult using conventional methods. It also is difficult, using conventional methods, to determine the manner in which such pattern elements should be divided into complementary pattern-element portions so as to eliminate reticle distortion.

The criterion for determining the threshold length L of a pattern element that may require complementary division depends upon the process used for fabricating the stencil reticle, the residual stress in the reticle membrane, the Young's modulus of the membrane, and other factors. Generally, L (termed herein the "division criterion") is several tens of film on the reticle. If a pattern element is linearly extended in only one dimension, then the element readily may be divided into multiple complementary portions each having a length equal to or less than L. However, if the pattern element extends in two dimensions or is a large-area element (e.g., a wiring pad) having both a long side "a" and short side "b" that are each longer than L, then complementary division conventionally is performed as shown in FIG. 14.

FIG. 14 depicts a square pattern element 60 having a first side of length "a"≧L and a second side of length "b"≧L. The first-side length "a" is divided into four portions, and the second-side length "b" is divided into four portions, thereby forming 16 small, square pattern-element portions 61 each having a length and width of less than L.

In the example depicted in FIG. 14, the complementarily divided pattern element 60 is defined in respective pattern-element portions on three stencil reticles (reticle 62, reticle 63, and reticle 64) as respective arrays of pattern-element portions 61. In each reticle 62, 63, 64 the constituent pattern-element portions 61 are arranged diagonally relative to each other, and each diagonal row is separated from the other in each reticle by two intervening diagonal rows. For example, reticle 62 defines six pattern-element portions 61 (each as a respective aperture in the membrane): one at the lower left corner, one at the upper right corner, and a diagonal row of four extending from the upper left corner to the lower right corner. This arrangement of apertures does not cause a problem with stress in the normal direction of gravity on the reticle membrane.

Unfortunately, however, in this example complementary division of the pattern element 60 requires three exposures to complete transfer of the pattern element 60 to the substrate, one respective exposure for each complementarily divided reticle 62, 63, 64. Other pattern elements may require a larger number of complementary divisions (and thus a larger number of exposures per element). These many exposures produce correspondingly large reductions in throughput, which are difficult to impossible to tolerate in a modern wafer-fabrication facility.

Also, in a stencil reticle, if a relatively small pattern element is present near a relatively large-area pattern element, stress-caused membrane deformation around the relatively large-area pattern element adversely affects the relatively small pattern element, causing positional displacement of the small element. This phenomenon also occurs with large-area pattern elements that are not so large as to require complementary division (except under special conditions such as when the membrane stress is sufficiently close to 0 Pa). Therefore, certain instances may require complementary division, even though the subject pattern element(s) would not require complementary division based solely on the size of the pattern element(s).

SUMMARY

In view of the shortcomings of the prior art as summarized above, the invention provides, inter alia, methods for complementarily dividing certain linearly extended and large-area pattern elements (or other pattern elements requiring complementary division) in stencil reticles such that throughput is not reduced significantly.

According to a first aspect of the invention, stencil reticles are provided that comprise a self-supporting reticle membrane defining apertures having respective opening profiles corresponding to respective pattern elements defined by the reticle. In an embodiment of such a reticle, among the pattern elements defined by the reticle, a linearly extended pattern element having a width less than a predetermined division criterion L and a length equal to or greater than L is complementarily divided into respective linear pattern-element portions each having a respective length less than L. Also, a large-area pattern element, having both length and width equal to or greater than L, is complementarily divided into respective linear pattern-element portions each having a respective width less than L and a respective length equal to or greater than L.

In general, the required pattern accuracy on a reticle intended for use in the 70-nm node is, for example, 50 nm. The division criterion L noted above is usually several tens of μm on the reticle. Hence, L is about two orders of magnitude larger than the pattern accuracy required on the reticle. In practice, high linewidth accuracy and precision usually are not required for large-area pattern elements such as wiring pads. Also, some positional displacement is allowable for large-area pattern elements such as wiring pads. Therefore, overall pattern-position accuracy is largely unaffected if large-area pattern elements are divided into linear pattern-element portions having lengths equal to or greater than L and widths less than L.

Desirably, in the stencil-reticle embodiment summarized above, the respective linear pattern-element portions formed from complementarily dividing the large-area pattern element each comprise at least one overlap region extending along an edge (shared with an edge of an adjacent pattern-element portion of the large-area pattern element when the large-area pattern element is projection-transferred from the reticle to a substrate) of the pattern-element portion. If the pattern elements exhibit any bending or the like on the reticle, the overlap regions reduce exposure anomalies that otherwise would occur at the bends when images of the pattern-element portions are projected onto and stitched together on the lithographic substrate.

In another embodiment of a stencil reticle, among the pattern elements defined by the reticle, a linearly extended pattern element having a width less than the predetermined division criterion L and a length equal to or greater than L is complementarily divided into respective linear pattern-element portions each having a respective length less than L. A large-area pattern element, having both length and width equal to or greater than L, is not complementarily divided.

Large-area pattern elements of which the sides (on the reticle) are at least, for example, 10·L in length often do not require high accuracy as defined on the reticle, so complementary division of such elements is unnecessary. Hence, in yet another embodiment of a stencil reticle, among the pattern elements defined by the reticle, linearly extended pattern elements having width less than the predetermined division criterion L and length equal to or greater than L are complementarily divided into respective linear pattern-element portions each having a respective length less than L. But, large-area pattern elements having both length and width equal to or greater than 10·L are not complementarily divided.

According to another aspect of the invention, charged-particle-beam (CPB) microlithography methods are provided. In an embodiment of such a method, a pattern is defined on a stencil reticle comprising a self-supporting reticle membrane defining apertures having respective opening profiles corresponding to respective elements of the pattern. At least a portion of the reticle is illuminated with a CPB illumination beam (e.g., electron beam). An image of the illuminated portion of the reticle is projected and focused onto a lithographic substrate. The illumination and projection steps are repeated as required to complete projection-transfer of the pattern to the lithographic substrate. The pattern is defined on the reticle such that, among the pattern elements defined by the reticle, a linearly extended pattern element having a width less than the predetermined division criterion L and a length equal to or greater than L is complementarily divided into respective linear pattern-element portions each having a respective length less than L. Also, a large-area pattern element, having both length and width equal to or greater than L, is complementarily divided into respective linear pattern-element portions each having a respective width less than L and a respective length equal to or greater than L.

Another embodiment of a CPB microlithography method comprises the general pattern-defining, illumination, and projection steps summarized above. However, instead of the specific pattern-defining details summarized above, the pattern is defined on the reticle such that, among the pattern elements defined by the reticle, a linearly extended pattern element having a width less than the predetermined division criterion L and a length equal to or greater than L is complementarily divided into respective linear pattern-element portions each having a respective length less than L. But, a large-area pattern element having both length and width equal to or greater than at least 1·L is not complementarily divided.

According to yet another aspect of the invention, methods are provided for configuring a stencil reticle. An embodiment of such a method comprises, with respect to pattern elements (defined by the reticle) that are linearly extended with a width less than the predetermined division criterion L and a length equal to or greater than L, complementarily dividing the pattern elements into respective linear pattern-element portions each having a respective length less than L. Also, with respect to large-area pattern elements, having both length and width equal to or greater than L, such pattern elements are complementarily divided into respective linear pattern-element portions each having a respective width less than L and a respective length equal to or greater than L. The pattern-element portions can be divided into at least a first group and a second group, wherein the first group is defined on a first stencil reticle, and the second group is defined on a second stencil reticle. Alternatively, the first and second groups can be defined on first and second regions, respectively, of the same stencil reticle. Furthermore, the pattern-element portions can be configured with overlap regions as summarized above.

In another embodiment of the methods for configuring a stencil reticle, with respect to linearly extended pattern elements having a width less than the predetermined division criterion L and a length equal to or greater than L, the pattern elements are complementarily divided into respective linear pattern-element portions each having a respective length less than L. But, large-area pattern elements, having both length and width equal to or greater than at least 1·L, are not complementarily divided.

In yet another embodiment of the methods for configuring a stencil reticle, the subject reticle includes a self-supporting reticle membrane exhibiting blocking behavior to an incident charged particle beam, and the membrane defines non-blocking regions of the membrane having respective profiles corresponding to respective pattern elements defined by the reticle. With respect to a pattern element in which the respective non-blocking region surrounds at least three sides of a protruding ("convex") blocking region having a width W and length H, a size error E of the pattern element is calculated from the length H and width W of the convex blocking region and from a length S of a side of the respective non-blocking region into which the blocking region protrudes. If the size error E is greater than a predetermined tolerance value T, then the pattern element is split into at least two complementary pattern-element portions. In this method embodiment, the size error E can be expressed as:

$$E=\{(k_1 \cdot H + k_2 \cdot S)^2 + [k_3 \cdot W/2]^2\}^{1/2}$$

wherein $k_1$, $k_2$, and $k_3$ are predetermined constants. The at least two complementary pattern-element portions can be defined on separate reticles or on separate regions of a single reticle.

In this regard, based upon examinations of the change in the shape of a pattern element caused by tensile force applied to a stencil reticle, it was discovered that, whenever an unexposed region on the lithographic substrate (corresponding to a respective "blocking region" on the reticle) includes a "protruding" ("convex" or "peninsular" portion) portion bounded on three sides by the respective exposed region, deformation of the pattern element caused by tensile stress is particularly great at the distal end of the protruding portion. It also was discovered that the magnitude of deformation is related to the length H and width W of the protruding portion and to the length S of the side of the pattern element from which the protruding portion extends, as expressed in the equation above.

Hence, at the time of determining the respective shapes of elements of a pattern to be transferred to the substrate, a determination is made as to whether an unexposed region on the substrate will include a protruding portion as summarized above. If the determination reveals such a feature associated with a pattern element, then the size error E of the pattern element is calculated, relative to the as-designed pattern element, using the equation noted above. If E>T, then the element is divided into complementary pattern-element portions. This allows the accuracy of the pattern element, as projection-transferred to the substrate, to be kept within an allowable range.

If the pattern element, including a protruding portion as summarized above, loses the protruding portion as a result of the pattern being divided into subfields, then there is no need to divide the pattern element in a complementary manner as summarized above.

Deformation of a pattern element is determined not only by H, W, and S, but also by the material of the reticle, the tension of the reticle, the size of the reticle, the demagnification ratio by which the pattern is transferred from the reticle to the substrate, and the reticle-manufacturing process. The term "reticle size" as used herein denotes the outside dimensions of the reticle (e.g., whether it was made from a 300-mm wafer or from a 200-mm wafer). Physical characteristics of the reticle also include the respective dimensions of the subfields, the membrane portions within the subfields, the arrangement subfields and membrane portions thereof, as well as the number, width, and arrangement of support struts. These factors were varied and subjected to finite-element and regression analyses to examine the relationships of these factors to the size error E of individual pattern elements relative to corresponding "as-designed" pattern elements. The equation noted above was found to approximate these relationships closely. In the equation the constants $k_1$, $k_2$, and $k_3$ have respective values determined by the material of the reticle, the reticle tension, the reticle size, the demagnification ratio, and the reticle-manufacturing process. So long as these parameters remain unchanged, these constants can be used regardless of the shapes of the elements of the pattern.

In yet another embodiment of the methods for configuring a stencil reticle, with respect to a pattern element in which the respective non-blocking region surrounds at least two sides of a blocking region having width $L_1$ and length $L_2$, a size error E of the pattern element is calculated from the width $L_1$ and length $L_2$ of the blocking region. If E>T, then the pattern element is divided into at least two complementary pattern-element portions. The size error E can be expressed as:

$$E = k_4 \cdot L_1 + k_5 \cdot L_2$$

wherein $k_4$ and $k_5$ are predetermined constants. Again, the at least two complementary pattern-element portions can be defined on separate reticles or on separate regions of a single reticle.

By examining changes in pattern-element shape caused by tensile stress in a stencil reticle, it was discovered that, whenever a non-blocking region has two sides bounded by a protruding ("convex") blocking region (i.e., the blocking region is configured as a two-sided protrusion into the respective non-blocking region), tensile deformation of the respective pattern element is especially great at the distal portion of the protrusion. It also was discovered that the magnitude of deformation is related to the lengths $L_1$ and $L_2$ of the sides of the protrusion, as expressed in the equation above.

Hence, at the time of determining the respective shapes of elements of a pattern to be transferred to the substrate, a determination is made as to whether an unexposed region on the substrate will include a protruding portion as summarized above. If the determination reveals such a feature associated with a pattern element, then the size error E of the pattern element is calculated, relative to the as-designed pattern element, using the equation noted above. If E>T, then the element is divided into complementary pattern-element portions.

If the pattern element, including a protruding portion as summarized above, loses the protruding portion as a result of the pattern being divided into subfields, then there is no need to divide the pattern element in a complementary manner as summarized above.

Deformation of a pattern element is determined not only by $L_1$ and $L_2$, but also by the material of the reticle, the tension of the reticle, the reticle size, the demagnification ratio, and the reticle-manufacturing process. These factors were varied and subjected to finite-element and regression analyses to examine the relationships of these factors to the size error E of individual pattern elements relative to corresponding "as-designed" pattern elements. The equation noted above as found to approximate these relationships closely. In the equation the constants $k_4$ and $k_5$ have respective values determined by the reticle material, the reticle tension, the reticle size, the demagnification ratio, and the reticle-manufacturing process. So long as these variables remain unchanged, these constants can be used regardless of the shapes of the elements of the pattern.

According to another embodiment of a CPB microlithography method, the pattern is defined, illuminated, and projected as generally summarized above. The pattern is defined on the reticle such that, among the pattern elements defined by the reticle, and with respect to a pattern element in which a respective non-blocking region surrounds at least three sides of a blocking region having width W and length H, the size error E is calculated from H and W and from the length S of a side of the respective non-blocking region into which the blocking region extends. If E>T, then the pattern element is divided into at least two complementary pattern-element portions. The size error E is expressed as:

$$E=\{(k_1 \cdot H + k_2 \cdot S)^2 + [k_3 \cdot W/2]^2\}^{1/2}$$

In yet another embodiment of a CPB microlithography method, the pattern is defined, illuminated, and projected as generally summarized above. The pattern is defined on the reticle such that, among the pattern elements defined by the reticle, with respect to a pattern element in which a respective non-blocking region surrounds at least two sides of a blocking region having width $L_1$ and length $L_2$, the size error E is calculated from $L_1$ and $L_2$. If E>T, then the pattern element is divided into at least two complementary pattern-element portions. The size error E is expressed as:

$$E = k_4 \cdot L_1 + k_5 \cdot L_2$$

The foregoing and additional features and advantages of the invention will be more readily apparent from the following detailed description, which proceeds with reference to the accompanying drawings.

BRIEF DESCRIPTION OF THE DRAWINGS

FIGS. 6(A) and 6(B) also schematically show the respective pattern-element portions as projection-exposed onto a lithographic substrate.

FIGS. 9(A)–9(B) also schematically show the respective pattern-element portions as projection-exposed onto a lithographic substrate.

DETAILED DESCRIPTION

The invention is described below in the context of representative embodiments that are not intended to be limiting in any way. Also, with respect to any embodiments described in the context of using an electron beam as an exemplary charged particle beam, it will be understood that the principles as described herein are applicable with equal facility to use of another type of charged particle beam as a lithographic energy beam, such as an ion beam.

Figure 1:
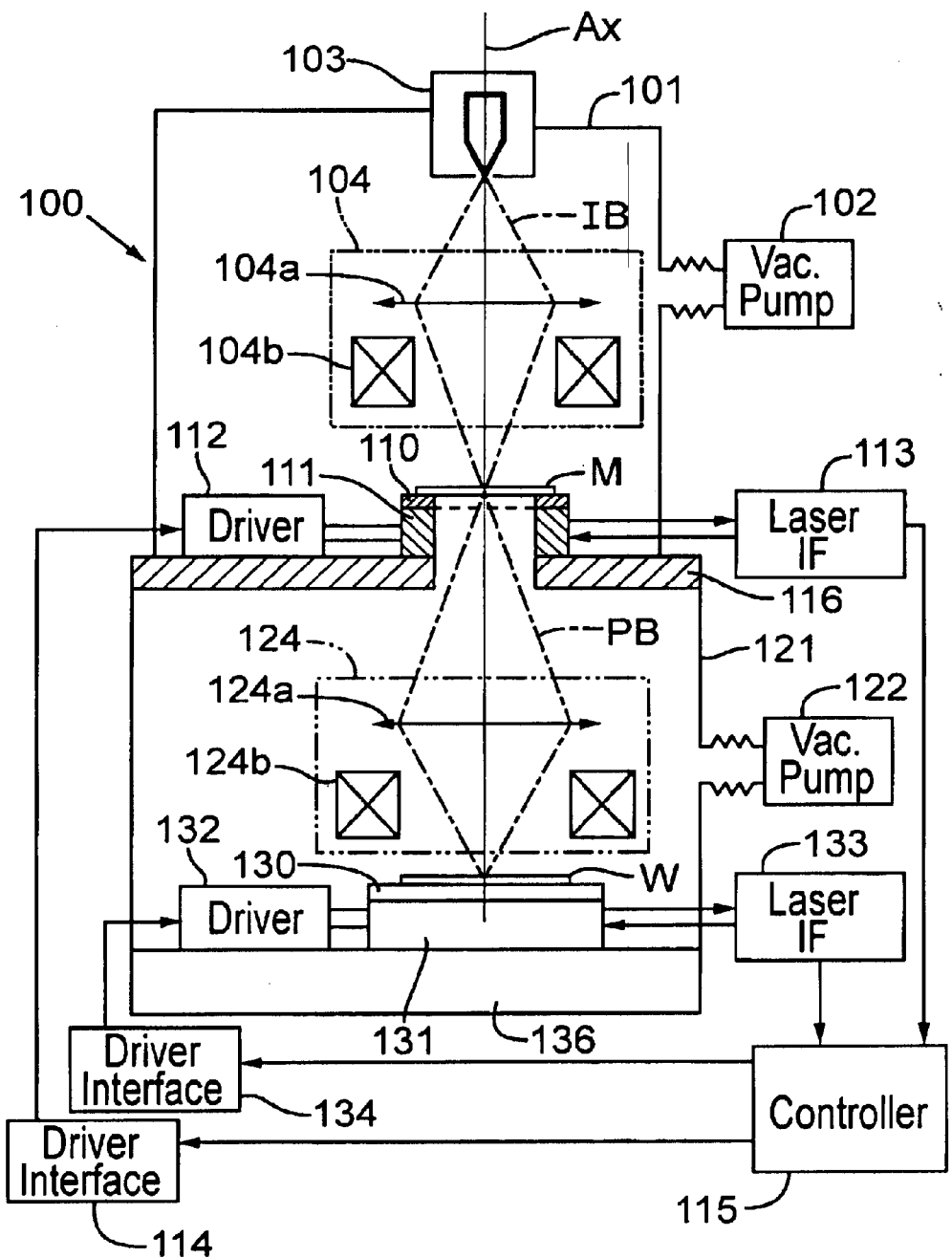
FIG. 1 is a schematic elevational view showing certain optical components and control relationships of a representative embodiment of a charged-particle-beam (CPB) microlithography system configured to projection-transfer a pattern from a stencil reticle as described herein, for example.

First, an embodiment of an electron-beam projection-exposure (microlithography) apparatus and method, employing a divided reticle, is provided below, referring to FIG. 1. FIG. 1 also depicts general imaging and control relationships of the subject system 100.

The system 100 comprises a first ("upper") optical column 101 configured as a vacuum chamber in this embodiment. The atmosphere inside the upper optical column 101 is evacuated to a suitable vacuum level using a vacuum pump 102 connected to the upper optical column 101.

An electron gun 103 is situated at the extreme upstream (topmost in the figure) portion of the upper optical column 101, and emits an electron beam ("illumination beam" IB) in a downstream direction (downward in the figure) along an optical axis Ax. Downstream of the electron gun 103 are an illumination-optical system 104 and a reticle M. The illumination-optical system 104 comprises a condenser lens 104a, a deflector 104b, and other components as required to cause the illumination beam IB to irradiate a desired region on the reticle M.

The illumination beam IB emitted from the electron gun 103 is condensed by the condenser lens 104a for illuminating the reticle M. The deflector 104b deflects the illumination beam IB in one or more lateral directions (e.g., Y-direction in the figure) on the reticle M within the optical field of the illumination-optical system 104. The reticle M in this embodiment is a divided stencil reticle of which the subfields are illuminated individually by the illumination beam IB in a sequential manner. The subfields are arrayed in rectilinear columns and rows on the reticle, wherein each row typically has a length (e.g., in the Y-direction in the figure) substantially equal to the width of the optical field of the illumination-optical system 104. In FIG. 1, the illumination-optical system 104 is depicted as having only a single optical unit (i.e., the condenser lens 104a). An actual illumination-optical system typically has multiple units of lenses, beam-shaping apertures, and the like.

The reticle M is secured by electrostatic attraction, vacuum suction, or other suitable means to a reticle chuck 110 mounted on an upstream-facing surface of a reticle stage 111. The reticle stage 111, in turn, is mounted on and is movable relative to a base 116.

The reticle stage 111 is actuated for movement in at least the X- and Y-directions by a reticle-stage driver 112 operably connected to the reticle stage 111. Although the reticle-stage driver 112 is depicted in the figure to the left of the reticle stage 111, the driver 112 typically is incorporated into the actual mechanism of the reticle stage 111. The reticle-stage driver 112 is connected to a controller 115 via a driver interface 114. In addition, a laser interferometer (IF) 113 is situated relative to the reticle stage 111 (on the right side of the reticle stage 111 in the figure). Actually, the laser interferometer 113 comprises at least two laser interferometers, one for detecting reticle-stage position in the X-direction and another for detecting reticle-stage position in the Y-direction in the figure. For use with these laser interferometers, respective moving mirrors (not shown) are mounted along respective edges of the reticle stage 111. The outwardly facing side surfaces of the moving mirrors are polished to high precision and used as the reflecting surfaces for the respective laser interferometers.

The laser interferometer 113 is connected to the controller 115 and serves to obtain accurate data concerning the position of the reticle stage 111 in the X-direction and Y-direction. The positional data obtained by the laser interferometer 113 is routed to the controller 115. To position the reticle stage 111 at a target position, a respective command is transmitted from the controller 115 to the driver interface 114. The driver interface 114, in response to the command, appropriately energizes the reticle-stage driver 112 to move the reticle stage 111 to the corresponding position. The components 111–115 functioning in this manner achieve accurate, real-time, feedback control of the position of the reticle stage 111.

A second ("lower") optical column 121 is situated downstream of the base 116. The lower optical column 121 is configured as a vacuum chamber in this embodiment and also serves as a "wafer chamber." The atmosphere inside the lower optical column 121 is evacuated to a suitable vacuum level using a vacuum pump 122 connected to the lower optical column 121. Situated inside the lower optical column 121 are a wafer W and a "projection-optical system" 124 including a condenser lens (projection lens) 124a and a deflector 124b.

The electron beam passing through the reticle M is termed the "patterned beam" PB. The patterned beam PB is condensed by the condenser lens 124a and deflected as required by the deflector 124b to form a focused image at a prescribed location on the wafer W of the illuminated region on the reticle M. Although, in the figure, the projection-optical system 124 is depicted as having only one optical unit (i.e., the condenser lens 124a), the projection-optical system 124 actually includes multiple (at least two) optical units. The optical units can comprise respective lenses only or respective lenses and deflector coils as required for proper image formation and for aberration correction. The combination of the illumination-optical system 104 and projection-optical system 124 is the "CPB-optical system" or "exposure-optical system."

The wafer W is held by electrostatic attraction, vacuum suction, or other suitable means to a wafer chuck 130 mounted on an upstream-facing surface of a wafer stage 131. The wafer stage 131, in turn, is mounted on and movable relative to a base 136.

The wafer stage 131 is actuated for movement in at least the X-direction and Y-direction by a wafer-stage driver 132 operably connected to the wafer stage 131. Although the wafer-stage driver 132 is depicted to the left of the wafer stage 131, the driver 132 typically is incorporated into the actual mechanism of the wafer stage 131 in a manner similar to that of the reticle stage 111. The wafer-stage driver 132 is connected to the controller 115 via a driver interface 134. In addition, a laser interferometer (IF) 133 is situated relative to the wafer stage 131 (on the right side of the wafer stage 131 in the figure). Actually, the laser interferometer 133 comprises at least two laser interferometers, one for detecting wafer-stage position in the X-direction and another for detecting wafer-stage position in the Y-direction in the figure. For use with these laser interferometers, respective moving mirrors (not shown) are mounted along respective edges of the wafer stage 131. The side surfaces of the outside of the moving mirrors are polished to high precision and used as the reflecting surfaces for the respective laser interferometers. The laser interferometers are connected to the controller 115 and serve to obtain accurate data concerning the position of the wafer stage 131 in the X-direction and Y-direction, respectively. The positional data obtained by the laser interferometer 133 are routed to the controller 115.

To position the wafer stage 131 at a target position, a respective command is transmitted from the controller 115 to the drive interface 134. The drive interface 134, in response to the command, appropriately energizes the wafer-stage driver 132 to move the wafer stage 131 to the corresponding position. The components 131–134 and 115 functioning in this manner achieve accurate, real-time, feedback control of the position of the wafer stage 131.

Figure 2A:
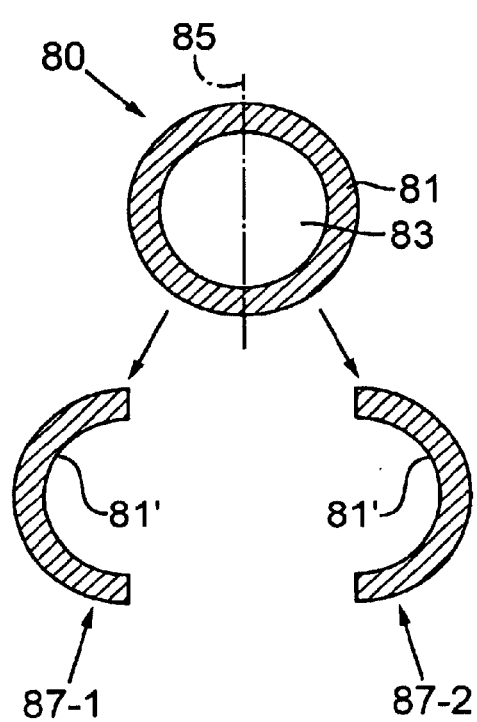
FIGS. 2(A)–2(B) are schematic plan views of an exemplary annular pattern element and an exemplary linearly extended pattern element, respectively, showing representative ways in which the pattern elements are divided into respective complementary pattern-element portions.
Figure 2B:
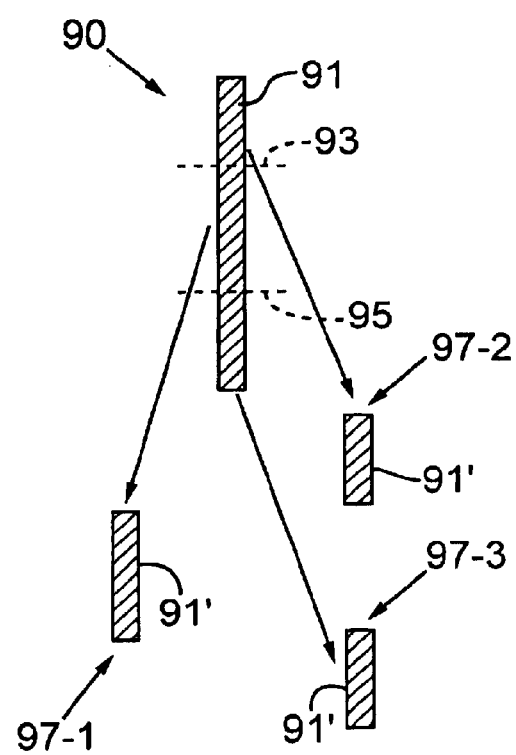

On a stencil reticle, an exemplary donut-shaped (annular) pattern element 80 is shown in FIG. 2(A), and an exemplary linear pattern element 90 is shown in FIG. 2(B). In each figure, each element is complementarily divided. The annular element 80 (FIG. 2(A)) is defined by a ring-shaped aperture 81 (freely transmissive to incident charged particles) and an "island" membrane portion 83 (through which charged particles pass with high forward scattering) in the center of the aperture 81. The pattern element 80 is divided into two pattern-element portions along a division line 85 extending through the center of the element 80. Thus, two pattern-element portions 87-1, 87-2 are formed, each defining a respective half-ring-shaped aperture 81'. The linear pattern element 90 (FIG. 2(B)) is defined by a long linear aperture 91 that, in this example, is longer than the division criterion for complementary division (e.g., the aperture 91 has a length of several tens of $\mu$m). Hence, in this example, the linear pattern element 90 is divided into three pattern-element portions 97-1, 97-2, 97-3, each defining a respective short aperture 91'. Division is along transverse division lines 93, 95.

Figure 3:
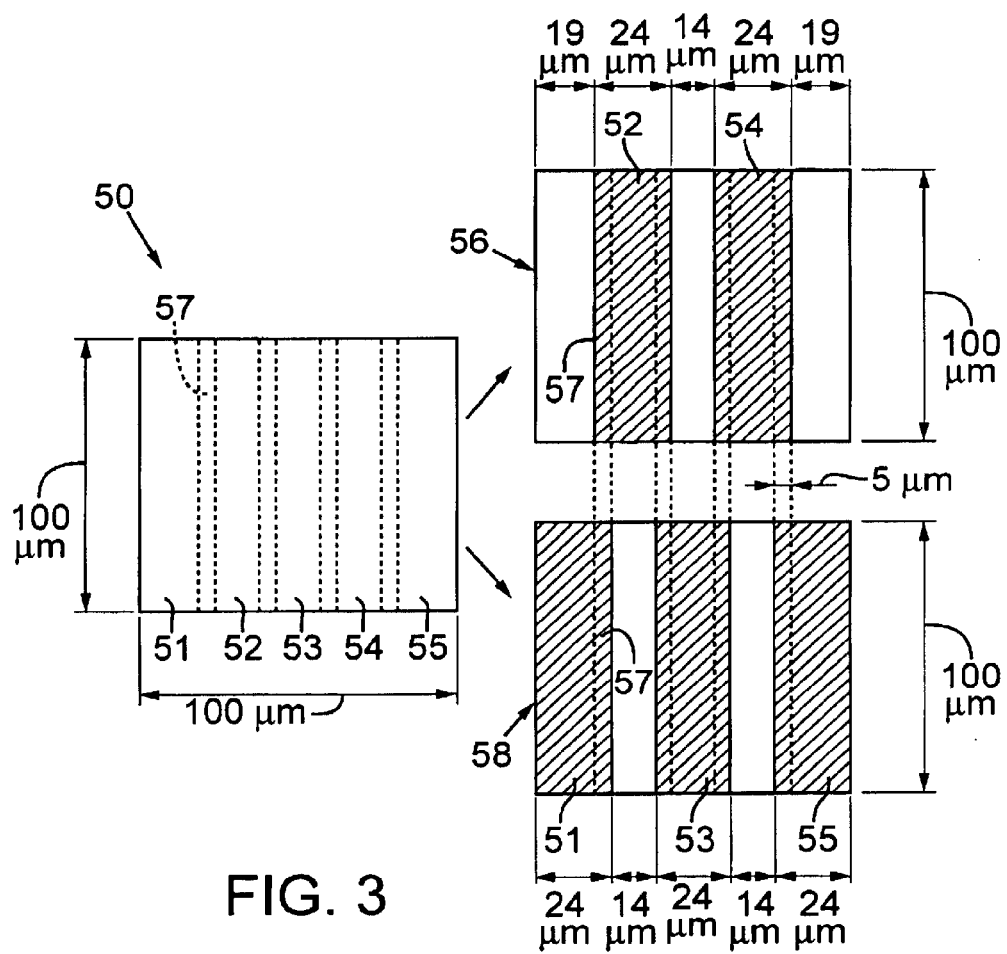
FIG. 3 is a schematic plan view of a first representative embodiment of complementary division of a large-area pattern element.

A first representative embodiment of complementary division of a large-area pattern element 50 (e.g., wiring pad) is shown in FIG. 3. The pattern element 50 is dimensioned, on the reticle, as a square aperture having 100-$\mu$m sides. The division criterion is a length L=30 $\mu$m. Hence, this pattern element 50 exceeds the division criterion.

According to this embodiment, the pattern element 50 is divided into five linear pattern-element portions 51, 52, 53, 54, 55 along vertically extended division lines. The linear portions 51–55 are divided into a first set of two pattern-element portions 52, 54 and a second set of three pattern-element portions 51, 53, 55. In each set the constituent pattern-element portions are separated from each other in an alternating manner. Each set is defined in a respective complementary stencil reticle 56, 58. I.e., the stencil reticle 56 defines the pattern-element portions 52, 54, and the stencil reticle 58 defines the pattern-element portions 51, 53, 55. Each pattern-element portion 51–55 has a respective length of 100 $\mu$m.

In addition, each pattern-element portion 51–55 is defined on the respective reticle 56, 58 as including a respective overlap region 57 on each long edge. When the pattern-element portions 51–55 are lithographically transfer-exposed onto a substrate, the overlap regions 57 of adjacent pattern-element portions overlap each other. The overlap regions 57 compensate for certain deformations of the respective pattern-element portions 51–55, such as bending. For example, if a pattern-element portion exhibits a bending of 1 μm, then providing the overlap regions 57 of the pattern-element portion with a width of 5 μm (on the reticle) adequately accommodates the 1-μm bend.

If the width of each overlap region 57 is 5 μm, then the width of each pattern-element portion 51–55 on the respective reticle 56, 58 is 24 μm. Also, on the reticle 56, the first pattern-element portion 52 is separated by 19 μm from the left edge of the pattern element 50, the second pattern-element portion 54 is separated from the first pattern-element portion 52 by 14 μm, and the second pattern-element portion 54 is separated by 19 μm from the right edge of the pattern element 50. On the reticle 58 the three pattern-element portions 51, 53, 55 are separated from one another by 14 μm.

Thus, each pattern-element portion 51–55 on the respective reticles 56, 58 has a length of 100 μm and a width of 24 μm. Each of these lengths exceeds the division criterion L, whereas the widths do not. However, the pattern element 50 is not a pattern element requiring strict accuracy and precision of projection. If bending of a pattern-element portion 51–55 should occur in the length direction, the bending can be accommodated without having to divide the element 50 further.

The manner of complementary division shown in FIG. 3 also can be used whenever a relatively small-area pattern element is situated near a large-area pattern element, even though the length of each side of the large-area pattern element is smaller than the division criterion L.

Also, regarding a large-area pattern element having each of length and width greater than the division criterion L (e.g., length and width each greater than 10·L), if high accuracy is not required during projection of the pattern element, the element may be transfer-exposed without performing complementary division of the element.

Figure 4:
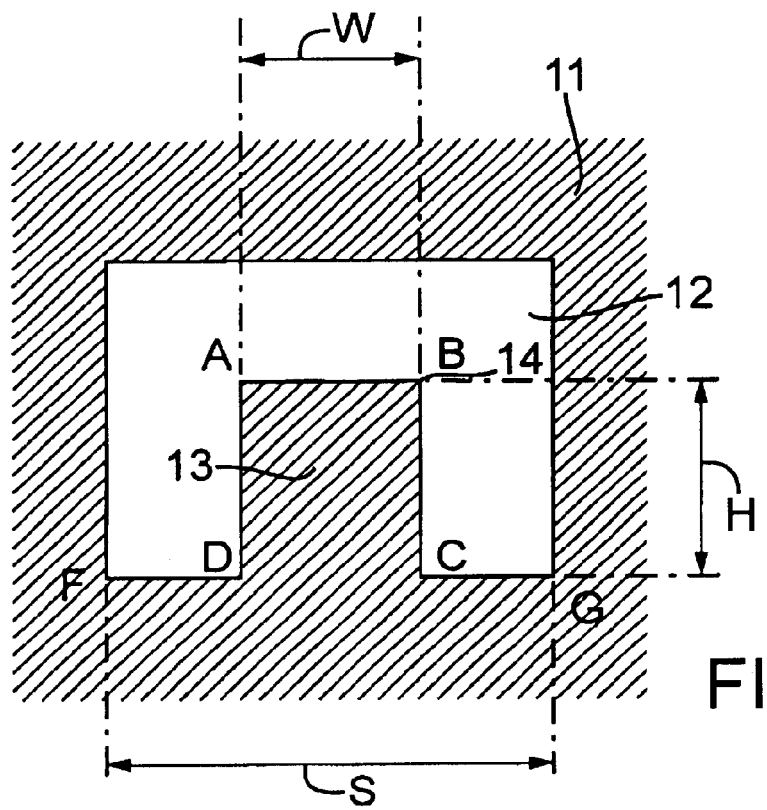
FIG. 4 is a schematic plan view of a pattern element that is subject to complementary division according to a second representative embodiment.

A second representative embodiment of complementary division is shown in FIG. 4. In the figure, a pattern element 12 defined as a corresponding aperture in the membrane of a stencil reticle is shown. The surrounding region 11 is of reticle membrane that is highly scattering to an incident charged particle beam. The region 11 is termed the "blocking region," and the region 12 is termed the "non-blocking region." "Blocking" as used here means that an incident charged particle is either absorbed by the blocking region 11 or passes through the blocking region 11 with substantial forward scattering. Of course, absorbed charged particles do not propagate downstream to the substrate, but forward-scattered charged particles may reach the substrate if the angle of forward scattering is sufficiently low. The non-blocking region 12 bounds three sides of a peninsular blocking region 13. With respect to this pattern element 12, the locations posing the greatest possible exposure error are the corners 14 (apices A and B) at the distal end of the peninsular blocking region 13.

Figure 5:
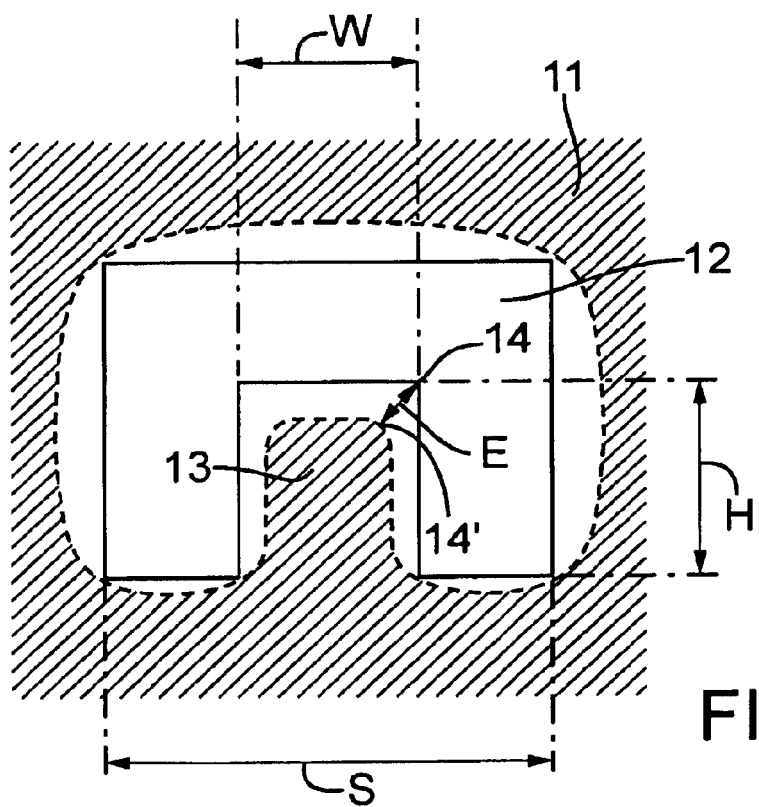
FIG. 5 is a schematic plan view of the pattern element of FIG. 4 as projection-exposed onto a lithographic substrate.

An exemplary profile of the pattern element that would be formed on the substrate from projection-exposure of the pattern element 12 in FIG. 4 is shown in FIG. 5. In FIG. 5 the dashed line delineates the as-projected profile, and the solid lines delineate the pattern element 12 as designed. Note that, in FIG. 5, the corners 14 as projected have shifted to respective corner locations 14', resulting in respective positional errors (size errors) "E" between the locations 14 and 14'.

The size error E can be approximated from the following equation:

$$E = \{(k_1 \cdot H + k_2 \cdot S)^2 + [k_3 \cdot W/2]^2\}^{1/2} \quad (1)$$

wherein H and W are the length and width, respectively, of the peninsular blocking region 13; S is the length of the side of the pattern element 12 from which the peninsular blocking region 13 extends; and $k_1$, $k_2$, and $k_3$ are respective predetermined constants (determined by the material of the reticle, the tension to which the reticle is subjected, the size of the reticle, and the demagnification ratio used for exposing the reticle). The correlation between the Young's modulus of the reticle and the stress applied to the reticle is especially high.

Dividing a pattern element whenever the calculated size error E exceeds a corresponding tolerance T allows the size error of each pattern-element portion as defined on complementary reticles to be below the tolerance limit. Any of various methods for dividing a pattern element can be used. In one well-known method, and referring further to FIG. 5, lines for horizontal and vertical division are extended from the corners 14 of the peninsular blocking region 13. The directions of the division lines (e.g., vertical in the figure) are determined by constraints such as not generating thereby a pattern-element portion so fine as to pose problems in production of a complementary reticle defining the pattern-element portion, or not producing a pattern-element portion having an extreme ratio of height to width. Reference is made to U.S. Pat. No. 5,166,888, incorporated herein by reference, for details.

Figure 6A:
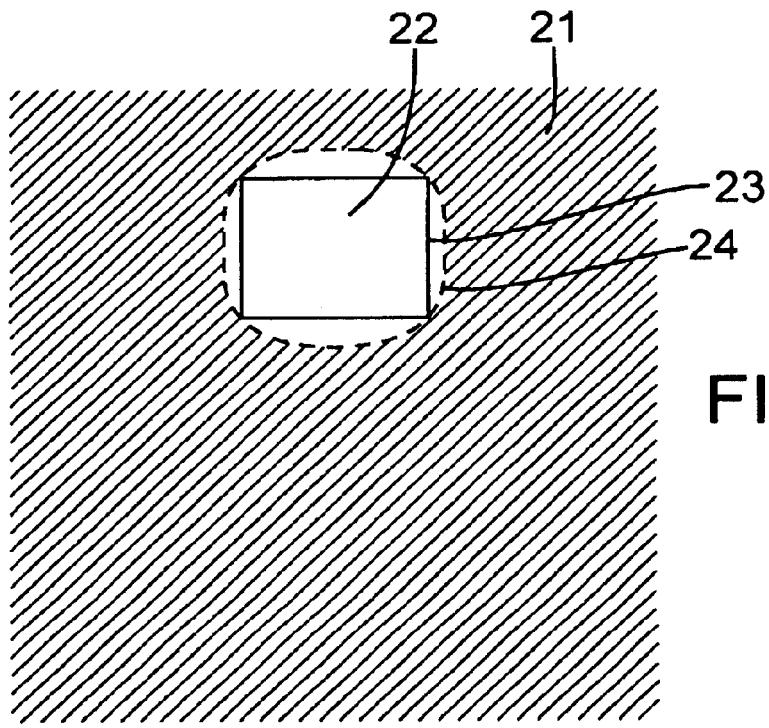
FIGS. 6(A)–6(B) are respective schematic plan views depicting exemplary pattern-element portions produced by complementary division of the pattern element shown in FIG. 4.
Figure 6B:
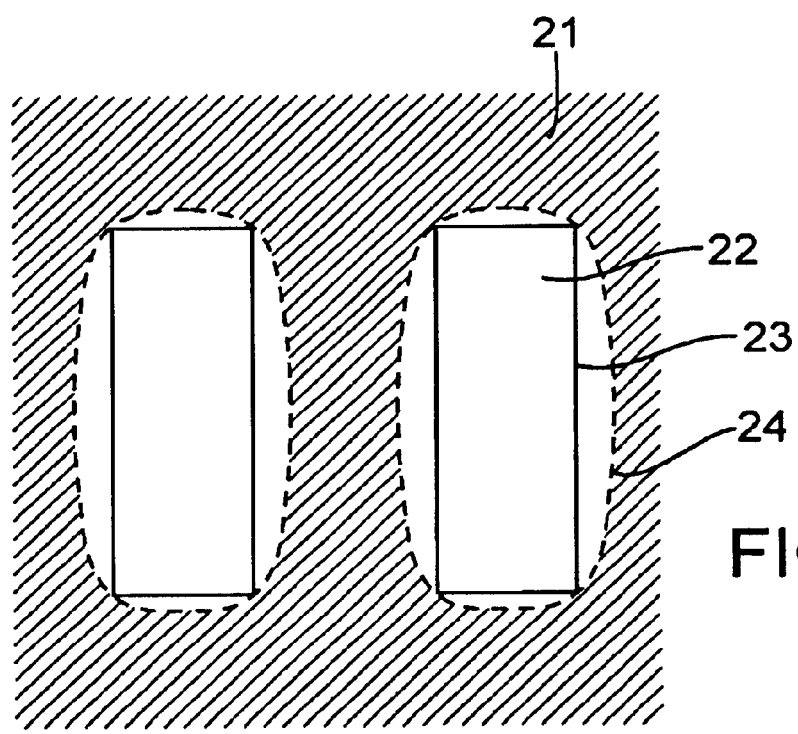

FIGS. 6(A) and 6(B) depict exemplary pattern-element portions produced by dividing the pattern element 12 shown in FIG. 4. In FIGS. 6(A)–6(B), items 21 are respective blocking regions, and items 22 are respective non-blocking regions. Items 23 are respective pattern-element portions (as defined on respective stencil reticles or on respective portions of a single stencil reticle), and items 24 (indicated by dashed lines) are the corresponding pattern-element portions as actually formed when projected onto the substrate.

Figure 7:
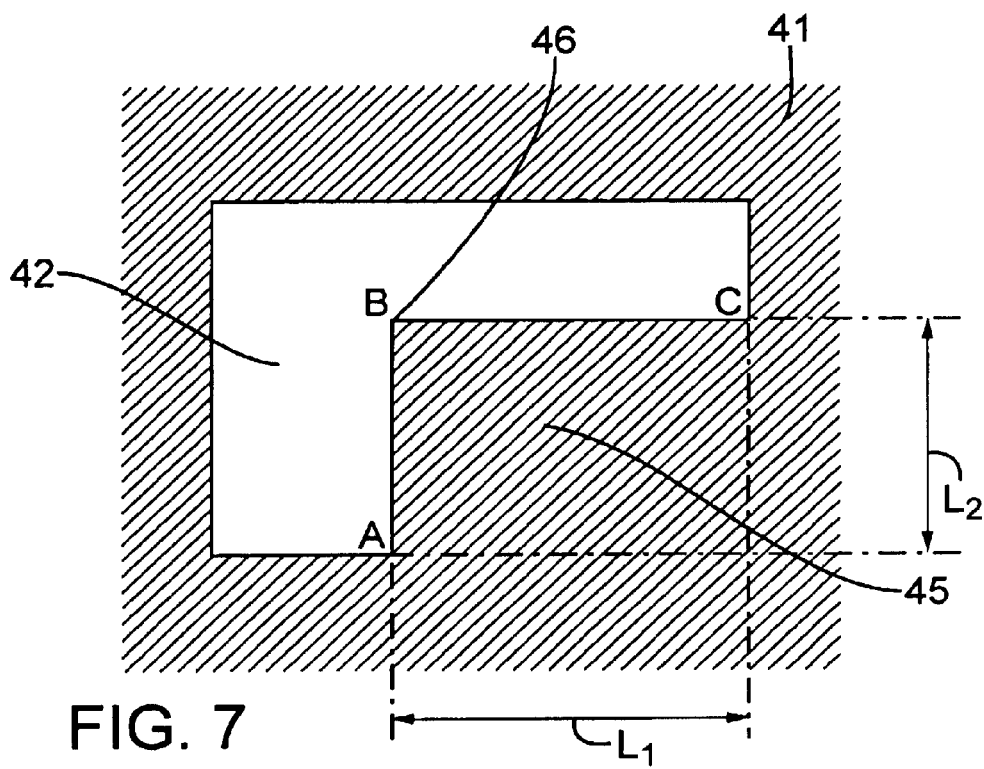
FIG. 7 is a schematic plan view of a pattern element that is subject to complementary division according to a third representative embodiment.

FIG. 7 illustrates another exemplary pattern element of an integrated circuit pattern, and is used in the following description of a third representative embodiment. In FIG. 7, item 41 is a blocking (membrane) region on the stencil reticle, and item 42 is a non-blocking region (aperture) in the reticle membrane. The non-blocking region 42 bounds two sides of a blocking region 45. The largest exposure error of this pattern element is prone to occur at the corner 46 (apex B) at the distal end of the blocking region 45.

Figure 8:
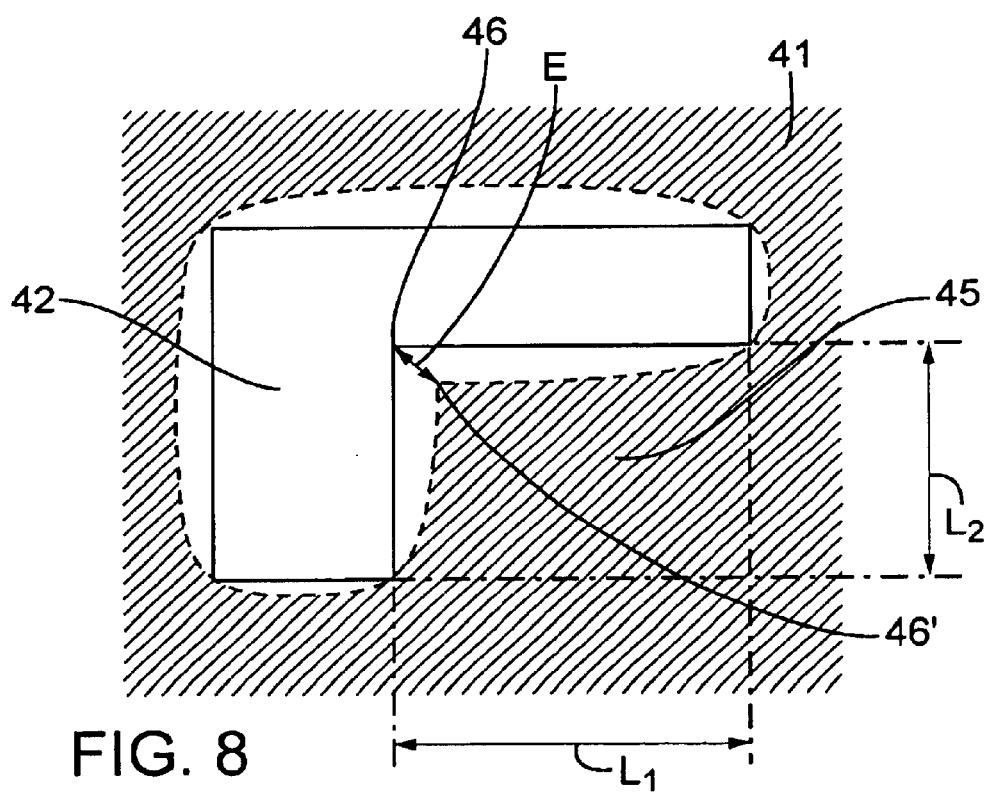
FIG. 8 is a schematic plan view of the pattern element of FIG. 7 as projection-exposed onto a lithographic substrate.

In FIG. 8, the dashed lines delineate the actual pattern element as formed on the substrate from exposure of the pattern element (non-blocking region) 42 in FIG. 7. The solid lines delineate the actual pattern element, shown in FIG. 7, as actually designed. As seen in FIG. 8, exposure causes the corner 46 to move to the location 46', resulting in the depicted positional error (size error) E therebetween.

From the lengths $L_1$ and $L_2$ of the blocking region 45 in FIGS. 7 and 8, the size error E in FIG. 8 can be approximated using the following equation:

$$E = k_4 \cdot L_1 + k_5 \cdot L_2 \quad (2)$$

wherein $k_4$ and $k_5$ are predetermined respective constants determined by the material of the reticle, the tension to which the reticle is subjected, the size of the reticle, and the demagnification ratio at which exposure is performed. The correlation between the Young's modulus of the reticle and the stress of the reticle is especially high.

Dividing the pattern element whenever the calculated size error E exceeds a corresponding tolerance value T allows the size error of the resulting pattern element to be less than a respective tolerance limit. The specific methods by which the pattern element can be divided are as discussed above with respect to the embodiment shown in FIGS. 4, 5, and 6(A)–6(B).

Figure 9A:
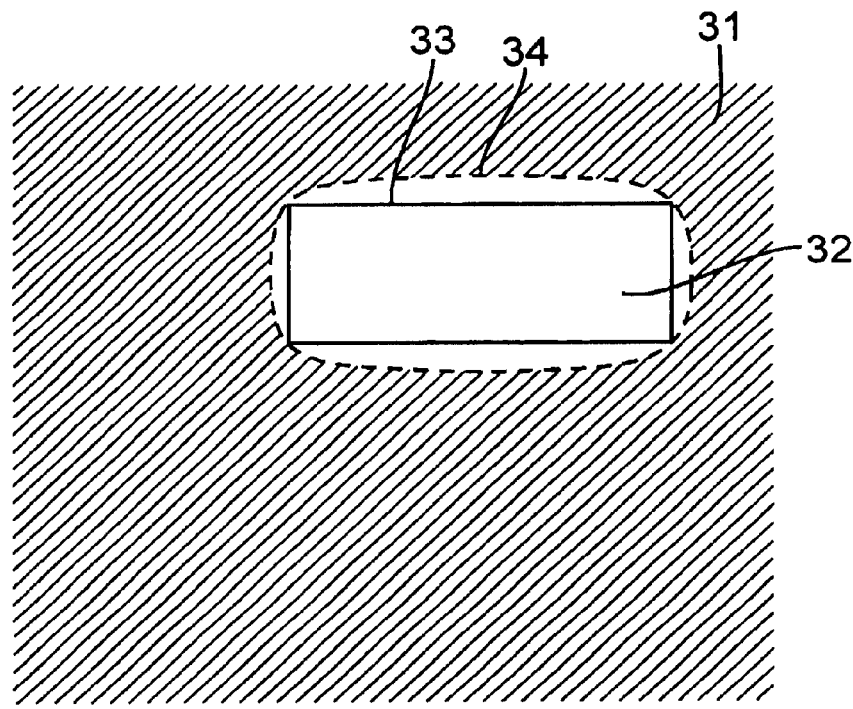
FIGS. 9(A)–9(B) are respective schematic plan views depicting exemplary pattern-element portions produced by complementary division of the pattern element shown in FIG. 7.
Figure 9B:
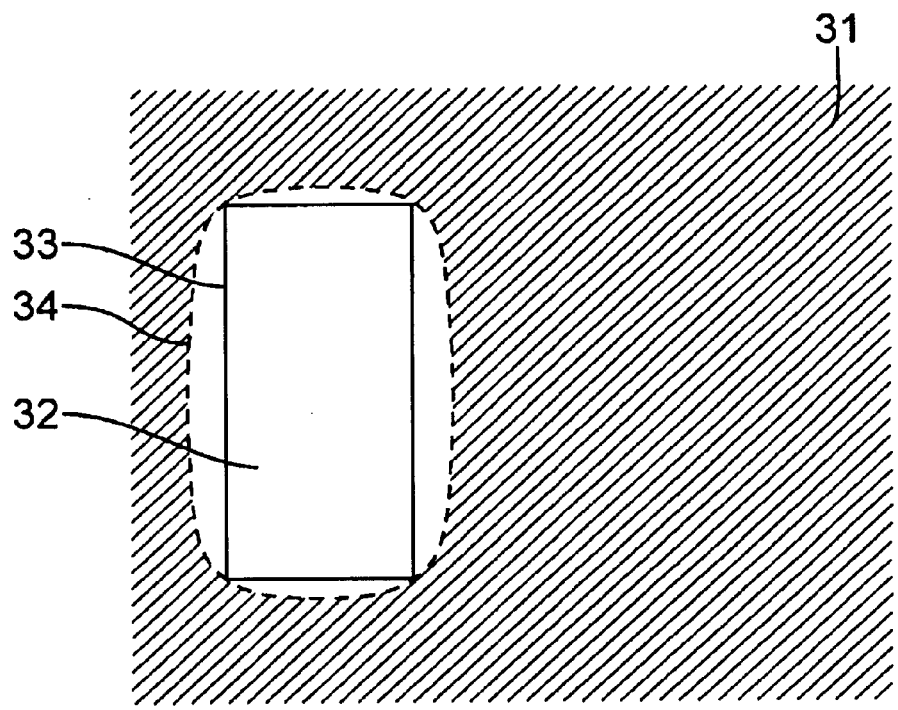

FIGS. 9(A)–9(B) depict an example division of the pattern element shown in FIG. 7. Complementary pattern-element portions are shown in FIGS. 9(A) and 9(B), respectively. In these figures, items 31 are respective blocking regions, items 32 are respective non-blocking regions, items 33 are respective pattern-element portions (as defined on the respective stencil reticles or on respective portions of a single stencil reticle), and items 34 (indicated by the dashed lines) are the respective pattern-element portions as actually projected onto the substrate.

Figure 10:
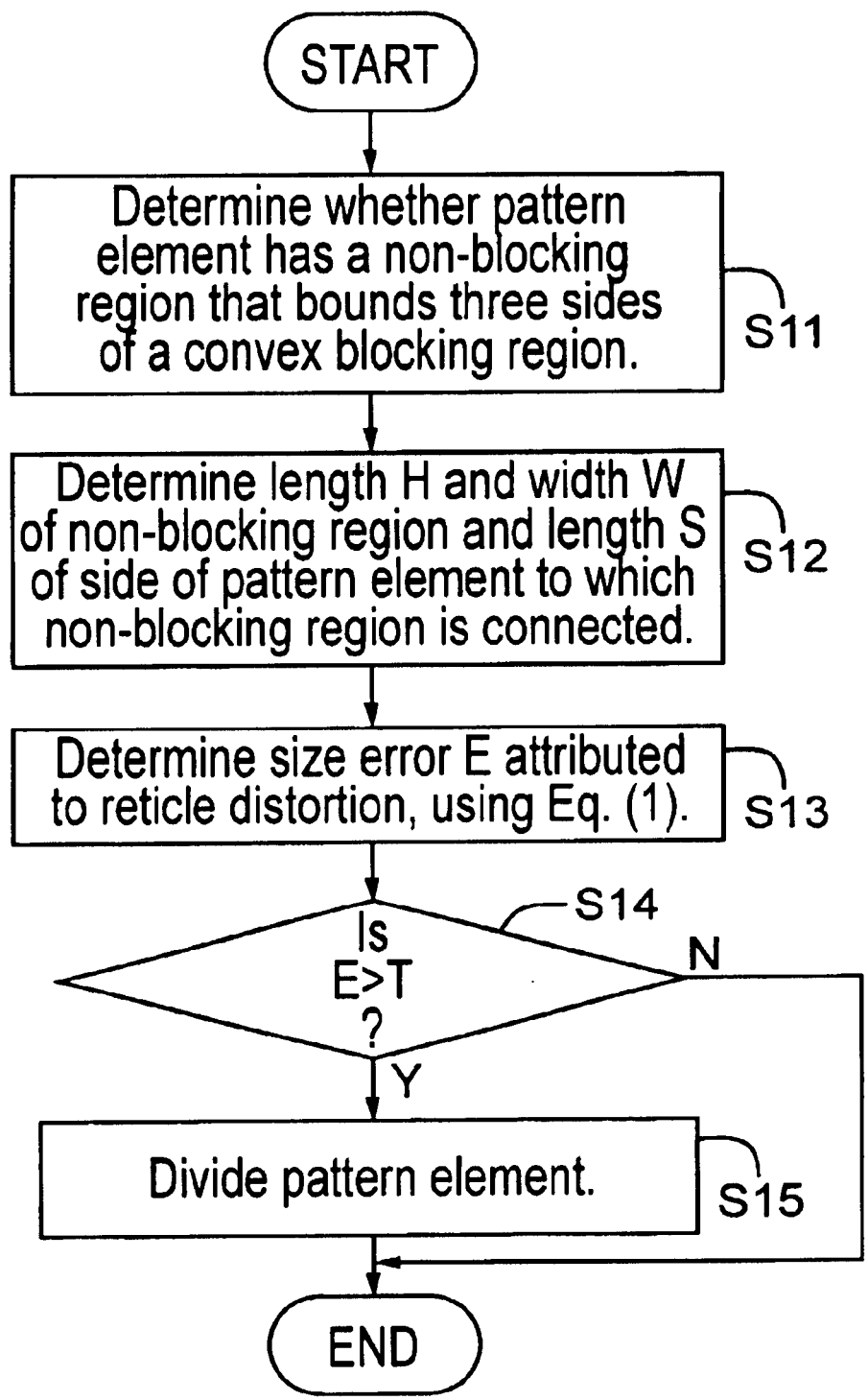
FIG. 10 is a flow chart of a first representative embodiment of a method for determining whether to complementarily divide a pattern element.

A first exemplary embodiment of a method according to the invention is set forth in the flow chart of FIG. 10. First, in step S11, a determination is made of whether a non-blocking region of a subject pattern element has a shape that bounds three sides of a corresponding blocking region. First, a determination is made of whether the corresponding blocking region is convex. Regarding a typical pattern element, the surrounding blocking region ordinarily defines a respective polyhedral non-blocking region that is a combination of respective "vertical" and "horizontal" lines. If the polyhedral non-blocking region itself is convex, then the blocking region does not have a convex portion.

If the corresponding blocking region is convex, then a determination is made of whether one or two apices of the blocking region define the convex portion. If the convex portion comprises two apices (in FIG. 4, the two apices A and B define the convex portion 13 of the blocking region), then the corresponding non-blocking region is regarded as bounding three sides of the convex blocking region, wherein the convex blocking region is defined by the edge joining the apices and the other two edges connected to the respective apices.

If the pattern element satisfies the determination made in step S11, then the length H and width W of the non-blocking region (defined by the convex blocking region) and the length S of the side of the pattern element on which the non-blocking region is located are measured in step S12. The width W is the distance between the two apices constituting the convex part of the blocking region. The length H is the length of each of the other two sides of the apices (e.g., each of the lengths AD and BC in FIG. 4). If the respective lengths H of the two sides are different, then a mean of the two lengths is calculated and used. The length S is the length of the side of the pattern element (e.g., the length FG in FIG. 4) to which the convex blocking region (e.g., rectangle ABCD in FIG. 4) is connected.

In step S13, the size error E attributable to distortion of the reticle at the subject pattern element is found using Equation (1). In step S14, a determination is made of whether the size error E is greater than the corresponding tolerance value T. If E>T, then the pattern element is divided in step S15 into complementary pattern portions.

Figure 11:
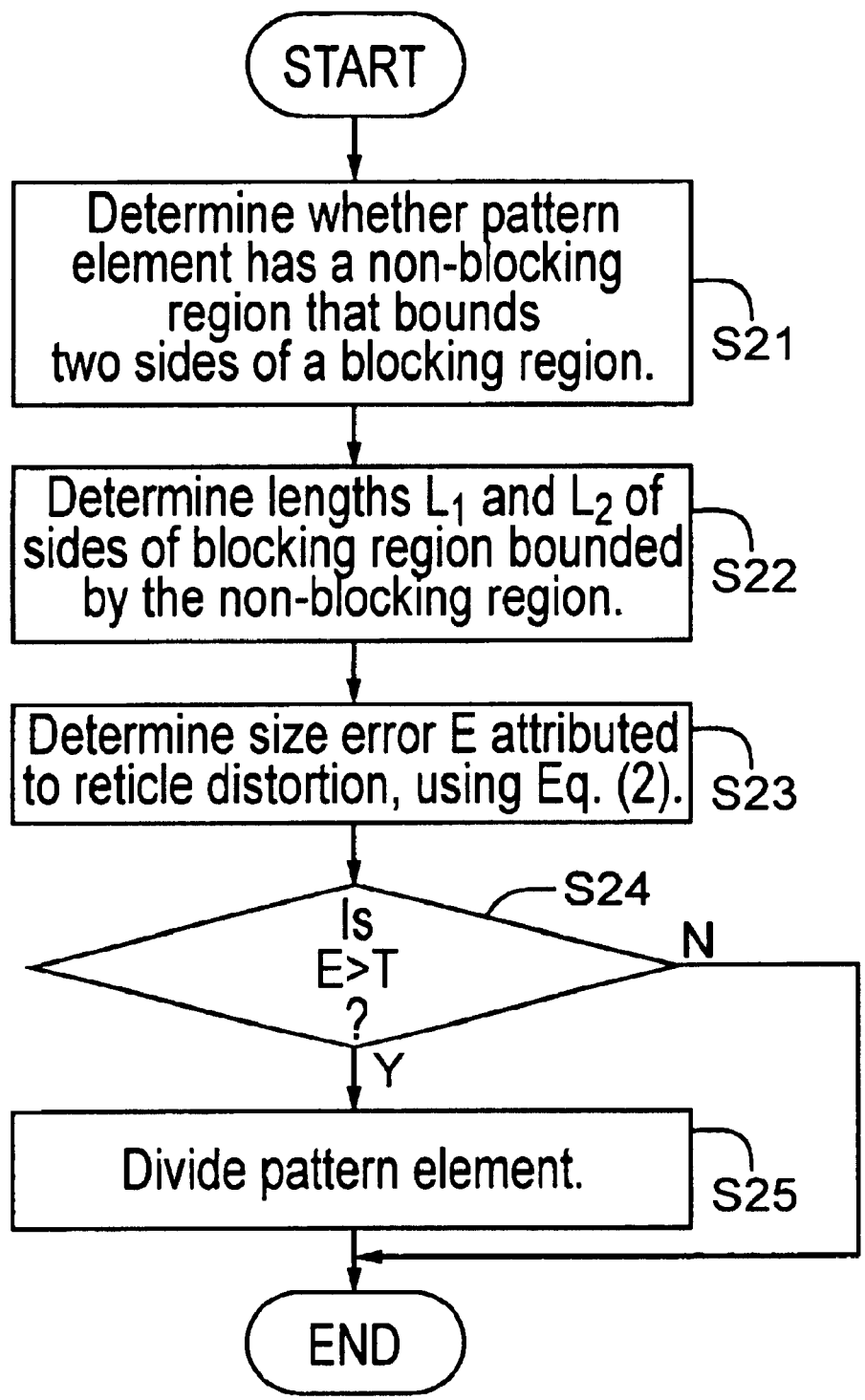
FIG. 11 is a flow chart of a second representative embodiment of a method for determining whether to complementarily divide a pattern element.
Figure 12:
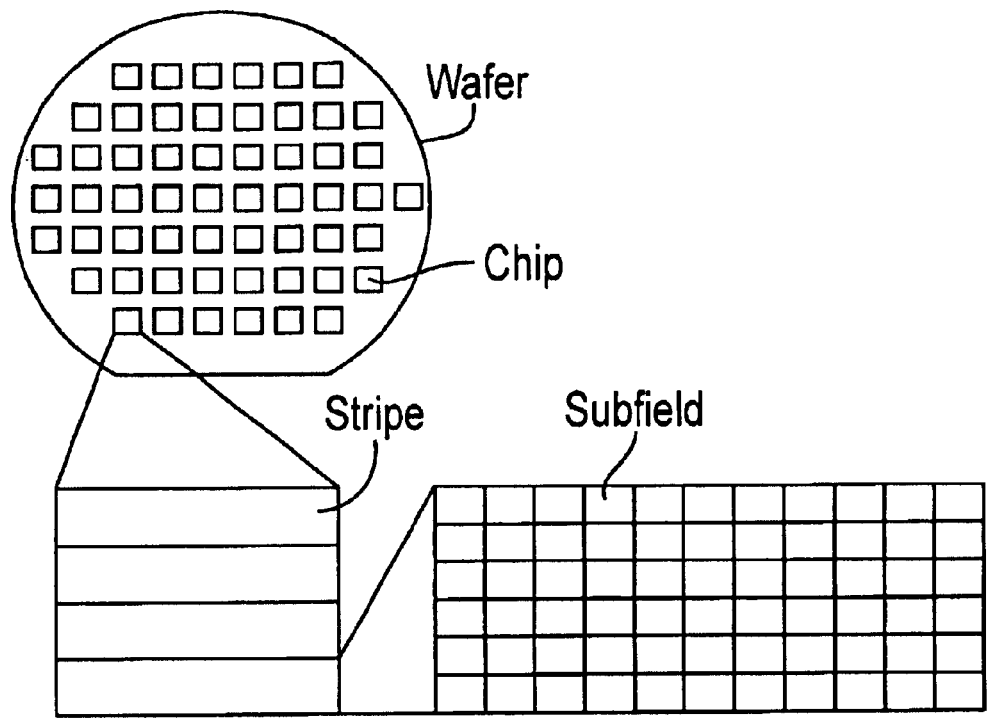
FIG. 12 is a schematic plan view showing the manner in which a pattern, as projection-exposed onto a substrate by CPB microlithography, conventionally is divided into stripes and subfields.
Figure 13:
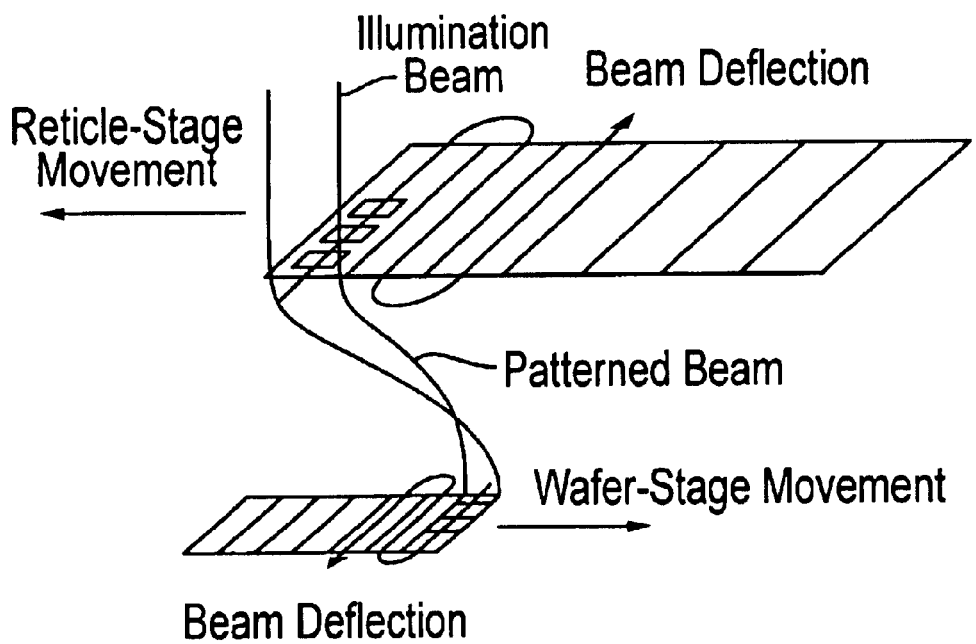
FIG. 13 is a schematic oblique view showing certain aspects of conventional projection-exposure in CPB microlithography.
Figure 14:
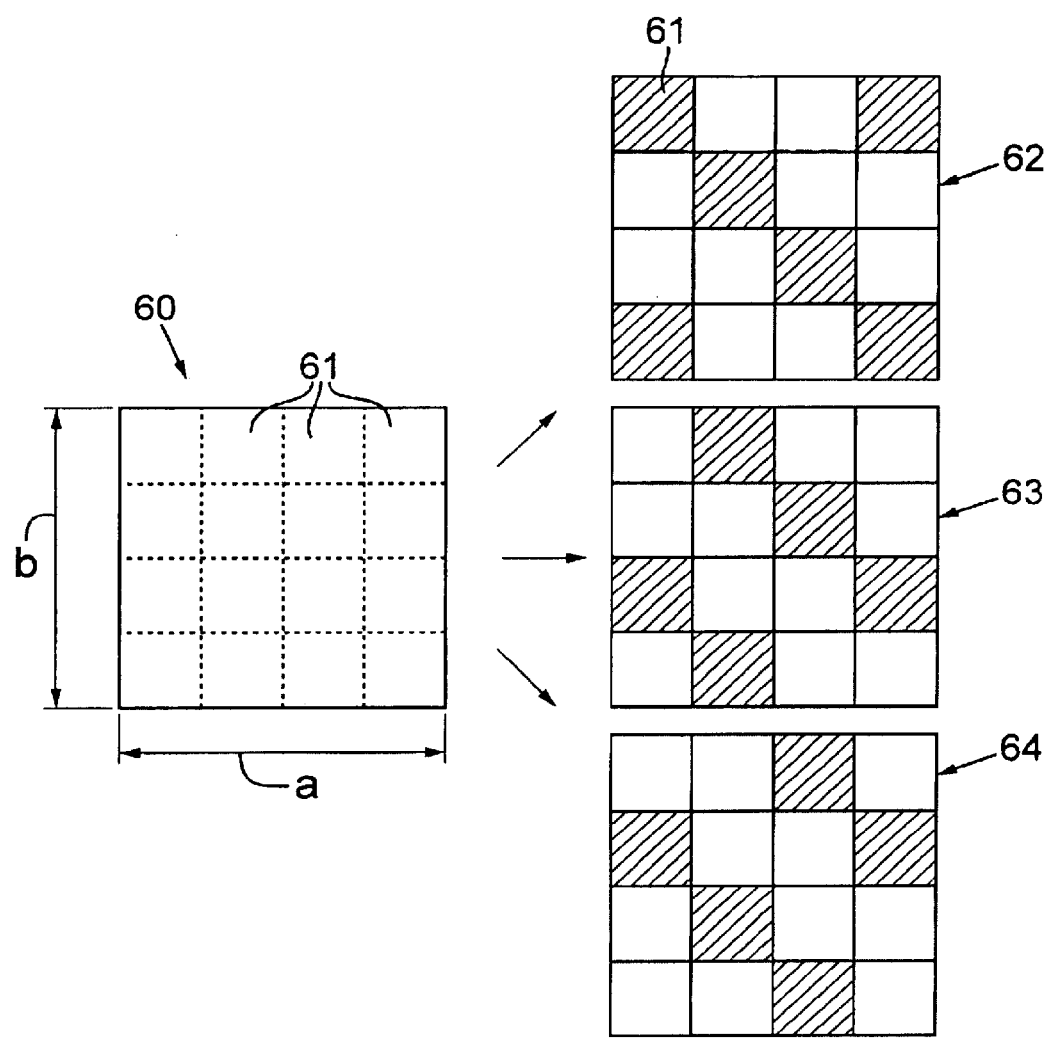
FIG. 14 is a schematic plan view of a conventional manner in which a large-area pattern element is divided into respective pattern-element portions that are defined in three respective complementary reticles.

A second exemplary embodiment of a method according to the invention is set forth in the flow chart of FIG. 11. First, in step S21, a determination is made of whether a non-blocking region of a subject pattern element bounds two sides of a corresponding blocking region. This determination is made by the same procedure as described with respect to FIG. 10, and results in a determination of whether the corresponding blocking region has a convex profile. If the blocking region has a convex profile, and if an apex of the blocking region defines the convex portion (e.g., in FIG. 7, the apex B defines the convex blocking region 45), then the non-blocking region will be regarded as bounding two sides of the corresponding blocking region that is defined by respective edges on either side of the apex (e.g., the edges AB and BC in FIG. 7). Whenever a convex part having such a shape is found, the lengths $L_1$ and $L_2$ of the two edges (along which the non-blocking region bounds the blocking region) are determined.

In step S23, the size error E attributable to distortion of the reticle is determined using Equation (2). In step S24 a determination is made of whether the size error E exceeds the respective tolerance value T. If E>T, then the pattern element is divided, in step S25, into complementary pattern portions.

Thus, methods are described above by which determinations are made of pattern elements of a reticle pattern to be defined on a stencil reticle. The methods result in an identification of pattern elements in which reticle distortion would cause the elements to exhibit, on the reticle, undesired profile changes from corresponding design-mandated profiles, resulting in problems with the dimensional accuracy of the transferred pattern. Based on these determinations, decisions are made as to whether to divide the subject pattern elements among multiple complementary reticles.

Whereas the invention has been described in connection with representative embodiments, it will be understood that the invention is not limited to those embodiments. On the contrary, the invention encompasses all modifications, alternatives, and equivalents as may be included within the spirit and scope of the invention, as defined by the appended claims.

What is claimed is:

1. A stencil reticle, comprising a reticle membrane defining apertures having respective opening profiles corresponding to respective pattern elements defined by the reticle, wherein, among the pattern elements defined by the reticle, (a) a linearly extended pattern element having a width less than a predetermined division criterion (L) and a length equal to or greater than L is complementarily divided into respective linear pattern-element portions each having a respective length less than L, and (b) a large-area pattern element having both length and width equal to or greater than L is complementarily divided into respective linear pattern-element portions each having a respective width less than L and a respective length equal to or greater than L.

2. The stencil reticle of claim 1, wherein the respective linear pattern-element portions formed from complementarily dividing the large-area pattern element each comprise at least one overlap region extending along an edge, shared with an edge of an adjacent pattern-element portion of the large-area pattern element when the large-area pattern element is projection-transferred from the reticle to a substrate, of the pattern-element portion.

3. A stencil reticle, comprising a reticle membrane defining apertures having respective opening profiles corresponding to respective pattern elements defined by the reticle, wherein, among the pattern elements defined by the reticle, (a) a linearly extended pattern element having a width less than a predetermined division criterion (L) and a length equal to or greater than L is complementarily divided into respective linear pattern-element portions each having a respective length less than L, and (b) a large-area pattern element having both length and width equal to or greater than L is not complementarily divided.

4. A stencil reticle, comprising a reticle membrane defining apertures having respective opening profiles corresponding to respective pattern elements defined by the reticle, wherein, among the pattern elements defined by the reticle, (a) a linearly extended pattern element having a width less than a predetermined division criterion (L) and a length equal to or greater than L is complementarily divided into respective linear pattern-element portions each having a respective length less than L, and (b) a large-area pattern element having both length and width equal to or greater than 10L is not complementarily divided.

5. A charged-particle-beam (CPB) microlithography method, comprising:

defining a pattern on a stencil reticle comprising a reticle membrane defining apertures having respective opening profiles corresponding to respective elements of the pattern;

illuminating at least a portion of the reticle with a CPB illumination beam;

projecting and focusing an image of the illuminated portion of the reticle onto a lithographic substrate; and repeating the illumination and projection steps as required to complete projection-transfer of the pattern to the lithographic substrate;

wherein the pattern is defined on the reticle such that, among the pattern elements defined by the reticle, (a) a linearly extended pattern element having a width less than a predetermined division criterion (L) and a length equal to or greater than L is complementarily divided into respective linear pattern-element portions each having a respective length less than L, and (b) a large-area pattern element having both length and width equal to or greater than L is complementarily divided into respective linear pattern-element portions each having a respective width less than L and a respective length equal to or greater than L.

6. The CPB microlithography method of claim 5, wherein, in the pattern-defining step, each of the respective linear pattern-element portions formed from complementarily dividing the large-area pattern element is configured with at least one overlap region extending along an edge, shared with an edge of an adjacent pattern-element portion of the large-area pattern element when the large-area pattern element is transferred from the reticle to the substrate during the projection step, of the pattern-element portion.

7. A charged-particle-beam (CPB) microlithography method, comprising:

defining a pattern on a stencil reticle comprising a reticle membrane defining apertures having respective opening profiles corresponding to respective elements of the pattern;

illuminating at least a portion of the reticle with a CPB illumination beam;

projecting and focusing an image of the illuminated portion of the reticle onto a lithographic substrate; and repeating the illumination and projection steps as required to complete projection-transfer of the pattern to the lithographic substrate;

wherein the pattern is defined on the reticle such that, among the pattern elements defined by the reticle, (a) a linearly extended pattern element having a width less than a predetermined division criterion (L) and a length equal to or greater than L is complementarily divided into respective linear pattern-element portions each having a respective length less than L, and (b) a large-area pattern element having both length and width equal to or greater than at least 1·L is not complementarily divided.

8. A method for configuring a stencil reticle including a reticle membrane defining apertures having respective opening profiles corresponding to respective pattern elements defined by the reticle, the method comprising:

with respect to pattern elements, defined by the reticle, that are linearly extended with a width less than a predetermined division criterion (L) and a length equal to or greater than L, complementarily dividing the pattern elements into respective linear pattern-element portions each having a respective length less than L; and with respect to large-area pattern elements having both length and width equal to or greater than L, complementarily dividing the pattern elements into respective linear pattern-element portions each having a respective width less than L and a respective length equal to or greater than L.

9. The method of claim 8, further comprising the steps of:

dividing the pattern-element portions into at least a first group and a second group; and defining the first group on a first stencil reticle and defining the second group on a second stencil reticle.

10. The method of claim 8, further comprising the steps of:

dividing the pattern-element portions into at least a first group and a second group; and defining the first group on a first region of the stencil reticle and defining the second group on a second region of the stencil reticle.

11. The method of claim 8, wherein each of the respective linear pattern-element portions formed from complementarily dividing the large-area pattern element is configured with at least one overlap region extending along an edge, shared with an edge of an adjacent pattern-element portion of the large-area pattern element when the large-area pattern element is transferred from the reticle to the substrate during the projection step, of the pattern-element portion.

12. A method for configuring a stencil reticle including a reticle membrane defining apertures having respective opening profiles corresponding to respective pattern elements defined by the reticle, the method comprising:

with respect to linearly extended pattern elements having a width less than a predetermined division criterion (L) and a length equal to or greater than L, complementarily dividing the pattern elements into respective linear pattern-element portions each having a respective length less than L; and not complementarily dividing large-area pattern elements having both length and width equal to or greater than at least 1·L.

13. A stencil reticle, formed by a method as recited in claim 8.

14. A stencil reticle, formed by a method as recited in claim 12.

15. A method for configuring a stencil reticle including a reticle membrane exhibiting blocking behavior to an incident charged particle beam, the membrane defining non-blocking regions of the membrane having respective profiles corresponding to respective pattern elements defined by the reticle, the method comprising:

with respect to a pattern element in which the respective non-blocking region surrounds at least three sides of a blocking region having a width (W) and length (H), calculating a size error (E) of the pattern element from the length H and width W of the blocking region and from a length (S) of a side of the respective non-blocking region into which the blocking region extends; and if the size error E is greater than a predetermined tolerance value (T), then dividing the pattern element into at least two complementary pattern-element portions.

16. The method of claim 15, wherein the size error E is expressed as:

$$E=\{(k_1 \cdot H + k_2 \cdot S)^2 + [k_3 \cdot W/2]^2\}^{1/2}$$

wherein $k_1$, $k_2$, and $k_3$ are predetermined constants.

17. The method of claim 15, wherein the at least two complementary pattern-element portions are defined on separate reticles.

18. The method of claim 15, wherein the at least two complementary pattern-element portions are defined on separate regions of a single reticle.

19. A method for configuring a stencil reticle including a reticle membrane exhibiting blocking behavior to an incident charged particle beam, the membrane defining non-blocking regions of the membrane having respective profiles corresponding to respective pattern elements defined by the reticle, the method comprising:

determining whether an element of a desired pattern, to be defined by the reticle, includes a non-blocking region that bounds three sides of a convex blocking region;

with respect to any pattern elements in which a non-blocking region bounds three sides of a convex blocking region, determining a length (H) and a width (W) of the non-blocking region and a length (S) of a side of the pattern element to which the non-blocking region is connected;

determining a size error (E) attributed to reticle distortion, using the expression $$E=\{(k_1 \cdot H + k_2 \cdot S)^2 + [k_3 \cdot W/2]^2\}^{1/2}$$

wherein $k_1$, $k_2$, and $k_3$ are predetermined constants;

for the pattern element, determining whether E is greater than a predetermined tolerance value (T);

if E>T, then dividing the pattern element into at least two complementary pattern-element portions; and defining the pattern-element portions on at least one stencil reticle.

20. A method for configuring a stencil reticle including a reticle membrane exhibiting blocking behavior to an incident charged particle beam, the membrane defining non-blocking regions of the membrane having respective profiles corresponding to respective pattern elements defined by the reticle, the method comprising:

with respect to a pattern element in which the respective non-blocking region surrounds at least two sides of a blocking region having width ($L_1$) and length ($L_2$), calculating a size error (E) of the pattern element from the width $L_1$ and length $L_2$ of the blocking region; and if the size error E is greater than a predetermined tolerance value (T), then dividing the pattern element into at least two complementary pattern-element portions.

21. The method of claim 20, wherein the size error E is expressed as:

$$E=k_4 \cdot L_1 + k_5 \cdot L_2$$

wherein $k_4$ and $k_5$ are predetermined constants.

22. The method of claim 20, wherein the at least two complementary pattern-element portions are defined on separate reticles.

23. The method of claim 20, wherein the at least two complementary pattern-element portions are defined on separate regions of a single reticle.

24. A method for configuring a stencil reticle including a reticle membrane exhibiting blocking behavior to an incident charged particle beam, the membrane defining non-blocking regions of the membrane having respective profiles corresponding to respective pattern elements defined by the reticle, the method comprising:

determining whether an element of a desired pattern, to be defined by the reticle, includes a non-blocking region that bounds at least two sides of a convex blocking region;

with respect to any pattern elements in which a non-blocking region bounds at least two sides of a convex blocking region, determining a width ($L_1$) and a length ($L_2$) of the non-blocking region;

determining a size error (E) attributed to reticle distortion, using the expression $$E=k_4 \cdot L_1 + k_5 \cdot L_2$$

wherein $k_4$ and $k_5$ are predetermined constants;

for the pattern element, determining whether E is greater than a predetermined tolerance value (T);

if E>T, then dividing the pattern element into at least two complementary pattern-element portions; and defining the pattern-element portions on at least one stencil reticle.

25. A stencil reticle, configured according to the method recited in claim 15.

26. A stencil reticle, configured according to the method recited in claim 19.

27. A stencil reticle, configured according to the method recited in claim 20.

28. A stencil reticle, configured according to the method recited in claim 24.

29. A charged-particle-beam (CPB) microlithography method, comprising:

defining a pattern on a stencil reticle comprising a reticle membrane defining non-blocking regions having respective opening profiles corresponding to respective elements of the pattern;

illuminating at least a portion of the reticle with a CPB illumination beam;

projecting and focusing an image of the illuminated portion of the reticle onto a lithographic substrate; and repeating the illumination and projection steps as required to complete projection-transfer of the pattern to the lithographic substrate;

wherein the pattern is defined on the reticle such that, among the pattern elements defined by the reticle, with respect to a pattern element in which the respective non-blocking region surrounds at least three sides of a blocking region having a width (W) and length (H), calculating a size error (E) of the pattern element from the length H and width W of the blocking region and from a length (S) of a side of the respective non-blocking region into which the blocking region extends; and if the size error E is greater than a predetermined tolerance value (T), then dividing the pattern element into at least two complementary pattern-element portions.

30. The CPB microlithography method of claim 29, wherein the size error E is expressed as:

$$E=\{(k_1 \cdot H + k_2 \cdot S)^2 + [k_3 \cdot W/2]^2\}^{1/2}$$

wherein $k_1$, $k_2$, and $k_3$ are predetermined constants.

31. A charged-particle-beam (CPB) microlithography method, comprising:

defining a pattern on a stencil reticle comprising a reticle membrane defining non-blocking regions having respective opening profiles corresponding to respective elements of the pattern;

illuminating at least a portion of the reticle with a CPB illumination beam;

projecting and focusing an image of the illuminated portion of the reticle onto a lithographic substrate; and repeating the illumination and projection steps as required to complete projection-transfer of the pattern to the lithographic substrate;

wherein the pattern is defined on the reticle such that, among the pattern elements defined by the reticle, with respect to a pattern element in which the respective non-blocking region surrounds at least two sides of a blocking region having width ($L_1$) and length ($L_2$), calculating a size error (E) of the pattern element from the width $L_1$ and length $L_2$ of the blocking region; and if the size error E is greater than a predetermined tolerance value (T), then dividing the pattern element into at least two complementary pattern-element portions.

32. The CPB microlithography method of claim 31, wherein the size error E is expressed as:

$$E = k_4 \cdot L_1 + k_5 \cdot L_2$$

wherein $k_4$ and $k_5$ are predetermined constants.

* * * * *

UNITED STATES PATENT AND TRADEMARK OFFICE
CERTIFICATE OF CORRECTION

PATENT NO. : 6,830,852 B2
DATED : December 14, 2004
INVENTOR(S) : Kawata et al.

It is certified that error appears in the above-identified patent and that said Letters Patent is hereby corrected as shown below:

Column 1,
Line 40, "be a transfer-exposed" should be -- be transfer-exposed --.

Column 3,
Line 8, "particle" should be -- particles --.
Line 64, "tens of film" should be -- tens of μm --.

Column 8,
Line 48, "above as found" should be -- above was found --.

Signed and Sealed this

Seventeenth Day of May, 2005

JON W. DUDAS
*Director of the United States Patent and Trademark Office*